United States Patent [19]

Nitta

[11] Patent Number: 5,790,581
[45] Date of Patent: Aug. 4, 1998

[54] OSCILLATION POLARIZATION MODE SELECTIVE SEMICONDUCTOR LASER, LIGHT TRANSMITTER AND OPTICAL COMMUNICATION SYSTEM USING THE LASER

[75] Inventor: Jun Nitta, Tokyo, Japan

[73] Assignee: Canon Kabushiki Kaisha, Tokyo, Japan

[21] Appl. No.: 833,994

[22] Filed: Apr. 9, 1997

Related U.S. Application Data

[63] Continuation of Ser. No. 387,437, Feb. 13, 1995, abandoned.

[30] Foreign Application Priority Data

Feb. 18, 1994 [JP] Japan .................................. 6-045197

[51] Int. Cl.$^6$ .................................................. H01S 3/18
[52] U.S. Cl. ............................................ 372/50; 372/27
[58] Field of Search .................................. 372/50, 27, 46; 257/18

[56] References Cited

U.S. PATENT DOCUMENTS

| 4,633,474 | 12/1986 | Akiba et al. ............... | 372/46 |
| 5,007,063 | 4/1991 | Kahen ........................ | 372/45 |
| 5,202,782 | 4/1993 | Nakamura et al. ......... | 359/152 |
| 5,373,166 | 12/1994 | Buchan et al. ............. | 257/18 |
| 5,440,581 | 8/1995 | Ono et al. .................. | 372/96 |
| 5,459,747 | 10/1995 | Takiguchi et al. .......... | 372/50 |
| 5,521,754 | 5/1996 | Nitta et al. ................. | 359/344 |

FOREIGN PATENT DOCUMENTS

| 0463569 | 1/1992 | European Pat. Off. . | |
| 0361035 | 4/1990 | Germany . | |
| 64-55889 | 3/1989 | Japan . | |
| 1-291483 | 11/1989 | Japan ................ | H01S 3/18 |
| 2-98186 | 4/1990 | Japan . | |
| 2159781 | 6/1990 | Japan . | |
| WO92/14174 | 8/1992 | WIPO . | |

OTHER PUBLICATIONS

Takayuki Matsuyama et al., "TM Mode Suppression Property of DFB Lasers with a Narrow Stripe Region", IEEE Photonics Technology Letters, vol. 2, No. 9 (Sep. 1990), pp. 612–613.

Primary Examiner—Rodney B. Bovernick
Assistant Examiner—Yisun Song
Attorney, Agent, or Firm—Fitzpatrick, Cella, Harper & Scinto

[57] ABSTRACT

An oscillation polarization mode selective semiconductor laser for selectively performing one of oscillations in different polarization modes, is provided. The semiconductor laser includes a substrate, a laser structure formed on the substrate, and a phase shift region formed in the laser structure. The laser structure includes an active region in which population inversion is established by a current injection thereinto. At least a portion of the phase shift region has a strained quantum well structure in which degrees of a change in refractive index for internal light in different polarization modes due to a current injection thereinto are different from each other. The polarization mode of a light output from the laser can be changed by a small amount of current injected into the phase shift region, and fluctuation in the output intensity can be suppressed during a transition operation in polarization mode.

13 Claims, 8 Drawing Sheets

OSCILLATION POLARIZATION MODE SELECTIVE SEMICONDUCTOR LASER, LIGHT TRANSMITTER AND OPTICAL COMMUNICATION SYSTEM USING THE LASER

This application is a continuation of application Ser. No. 08/387,437, filed Feb. 13, 1995, now abandoned.

BACKGROUND OF THE INVENTION

1. Field of the Invention

The present invention relates to a semiconductor laser whose oscillation polarization mode can be changed by an external control and which is suitable for use as a light source apparatus in the field of optical communications, for example. The present invention further relates to an optical communication system and a light transmitter which use the above-mentioned semiconductor laser, respectively.

2. Related Background Art

As a conventional device, Japanese Patent Application Laid-Open No.2(Heisei)-159781 discloses a distributed feedback (DFB) laser whose oscillation polarization mode can be changed by an external control. In this DFB laser, three electrodes are arranged, and carrier injection into an electrode for phase adjustment and formation of population inversion cause a change in the phase of internal light. Thus, the oscillation occurs in either of transverse electric (TE) and transverse magnetic (TM) modes whose threshold gain is lower. Specifically, a change in carrier density is caused by a current injected through one electrode, and the grating pitch at a current-injected portion is optically varied due to a change in refractive index thereat. As a result, threshold gains at phase-matching wavelengths for TE and TM modes are changed, and hence one of light outputs in TE and TM modes can be selectively obtained.

In the above-discussed device, however, the refractive index at a phase adjusting region is changed by the carrier injection thereinto, wavelengths, at which phase conditions for TE and TM modes are satisfied, are varied, and the oscillation polarization mode of its output is selected by changing the threshold gains for TE and TM modes.

Therefore, a transition range, in which the intensity of oscillated light gradually changes, exists when the polarization mode of the oscillated light is switched between one mode and the other mode. In that transition range, the wavelengths, at which phase conditions for TE and TM modes are satisfied, vary until the threshold gain of light in a non-oscillated polarization mode becomes smaller than the threshold gain of light in an oscillated polarization mode. In other words, the threshold gains of TE and TM modes vary as the wavelengths, at which phase conditions for TE and TM modes are satisfied, vary, and hence the intensity of oscillated light also gradually changes.

SUMMARY OF THE INVENTION

It is an object of the present invention to provide an oscillation polarization mode selective semiconductor laser whose oscillation polarization mode can be changed by an injected current control and which solves the above problem, a driving method of this semiconductor laser, a light transmitter or transceiver including this semiconductor laser and an optical communication system using this semiconductor laser.

According to one aspect of the present invention, there is provided an oscillation polarization mode selective semiconductor laser for selectively performing one of oscillations in different polarization modes, which includes a substrate, a laser structure formed on the substrate, and a phase shift region formed in the laser structure. The laser structure includes an active region in which population inversion is established by a current injection thereinto. At least a portion of the phase shift region has a strained quantum well structure in which degrees of a change in refractive index for internal light in different polarization modes due to a current injection thereinto are different from each other.

The strained quantum well structure may comprise at least one of a first strained quantum well structure into which a tensile strain is introduced and a second strained quantum well structure into which a compressive strain is introduced. The first and second strained quantum well structures are electrically controllable independently from each other.

According to another aspect of the present invention, there is provided a driving method for driving the oscillation polarization mode selective semiconductor laser described immediately above, which includes a step of injecting a direct current, which has a constant intensity, into the active region, and a step of injecting a modulated current, which has a modulation frequency, into the phase shift region.

According to still another aspect of the present invention, there is provided a driving method for driving the oscillation polarization mode selective semiconductor laser described immediately above, which includes a step of injecting a direct current, which has a constant intensity, into the active region, a step of injecting a first modulated current, which has a modulation frequency, into one of the first and second strained quantum well structure, and a step of injecting a second modulated current, which has a modulation frequency in anti-phase with the modulation frequency of the first modulated current, into the other of the first and second strained quantum well structure.

According to yet another aspect of the present invention, there is provided a light transmitter which includes the oscillation polarization mode selective semiconductor laser described immediately above, a control unit for modulating output light of the semiconductor laser in its polarization mode in accordance with an input signal supplied to the control means, and a polarization mode selective unit for transmitting therethrough only light in one of the different polarization modes from the semiconductor laser.

According to yet another aspect of the present invention, there is provided an optical communication system which includes the light transmitter described immediately above, a transmission unit for transmitting the light selected by the polarization mode selective unit, and a receiver for receiving the light transmitted by the transmission unit. The system may be constructed as a wavelength division multiplexing communication system, for example.

According to this invention, a phase shift region involves a strained quantum well structure in which degrees of a change in refractive index due to a carrier injection thereinto is different between different polarization modes (for example, TE and TM modes). Hence, the polarization mode of a light output can be changed by a current whose amount is smaller than that of a prior art device. Further, fluctuation in the output intensity can be suppressed during a transition or change operation in polarization mode since a change in refractive index for one polarization mode is smaller than a change in refractive index for the other polarization mode.

These advantages and others will be more readily understood in connection with the following detailed description of the preferred embodiments taken in conjunction with the drawings.

DESCRIPTION OF THE PREFERRED EMBODIMENTS

First Embodiment

Figure 1:
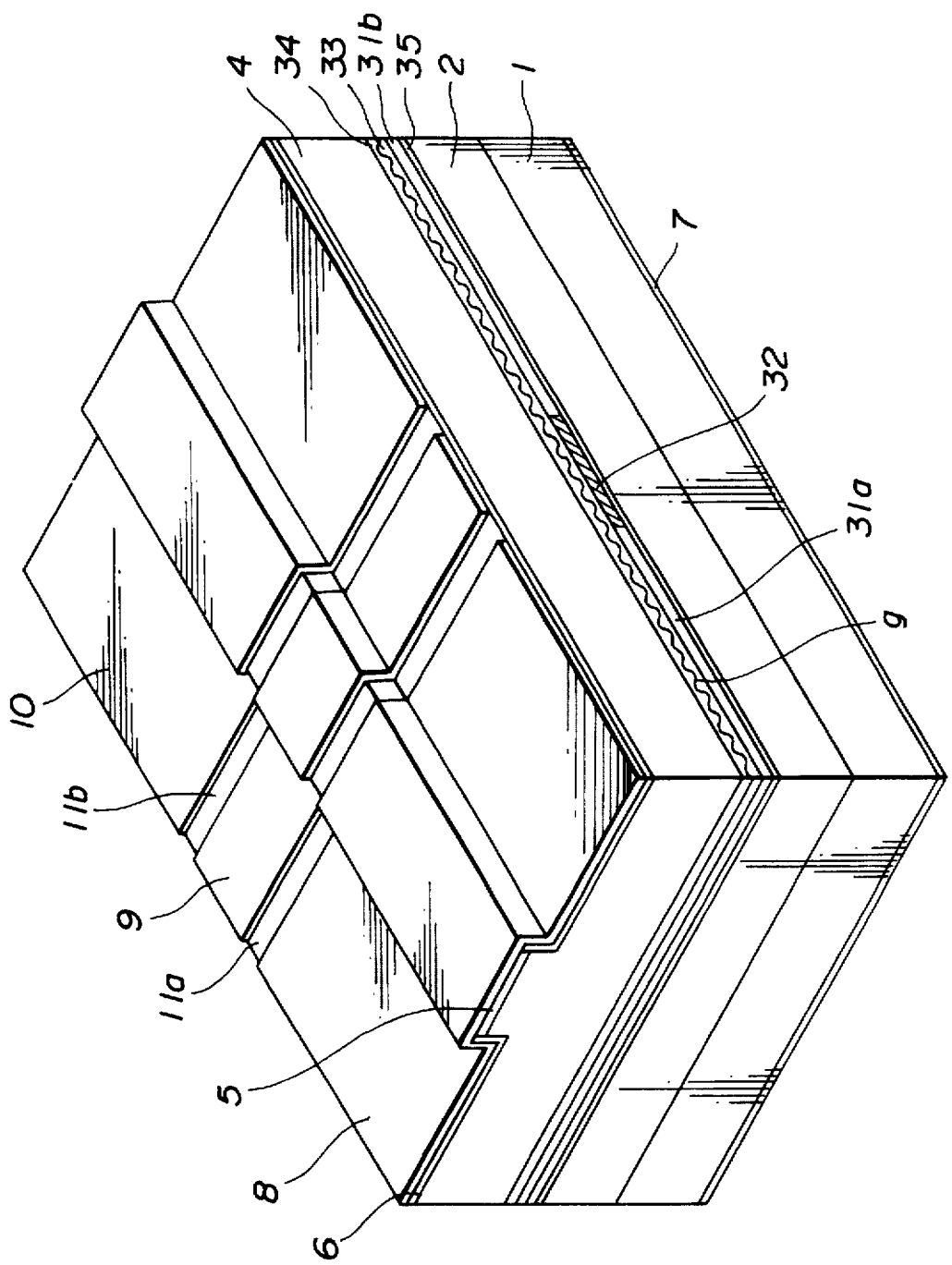
FIG. 1 is a perspective view illustrating the schematic structure of a first embodiment of a semiconductor laser constructed in accord with the present invention.

A first embodiment of the present invention will be described with reference to FIGS. 1 through 5 which illustrate a semiconductor laser having a distributed feedback structure constructed in accord with the present invention. In FIG. 1, reference numeral 1 is a n-type GaAs substrate. Reference numeral 2 is an n-type $Al_{0.5}Ga_{0.5}As$ first clad layer. Reference numerals 31a and 31b are respectively active layers in which induced emission occurs by a current injection thereinto. Reference numeral 32 is a phase shift region or phase adjusting layer. Reference numeral 33 is an undoped $Al_{0.3}Ga_{0.7}As$ carrier confinement layer for confining carriers in the active layers 31a and 31b. Reference numerals 34 and 35 are respectively undoped $Al_{0.4}Ga_{0.6}As$ separate confinement heterostructure (SCH) layers. Reference numeral 4 is a p-type $Al_{0.5}Ga_{0.5}As$ second clad layer. Reference numeral 5 is a p-type GaAs cap layer. Reference numeral 6 is an insulating layer. Reference numeral 7 is a first electrode formed on the bottom surface of the substrate 1, and reference numerals 8, 9 and 10 are respectively second, third and fourth electrodes formed on the cap layer 5. Reference numerals 11a and 11b are respectively separating grooves for electrically separating the electrodes 8, 9 and 10 from each other.

Figure 2:
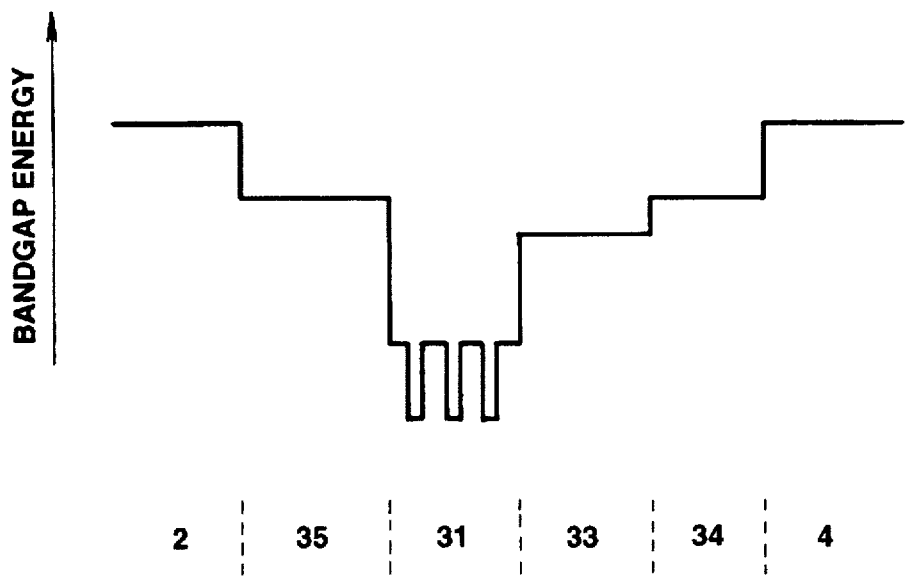
FIG. 2 illustrates the energy band structure of an active region of the first embodiment.

FIG. 2 illustrates bandgaps of the layers near (and including) the active layers 31a and 31b and a grating g, using only energy levels in the conduction band. The grating g is formed at a boundary between the carrier confinement layer 33 and the SCH layer 34. The active layers 31a and 31b respectively consist of three quantum wells. The well layer is a GaAs layer having a thickness of 60Å, and the barrier layer is an $Al_{0.3}Ga_{0.7}As$ layer having a thickness of 100Å.

Figure 3:
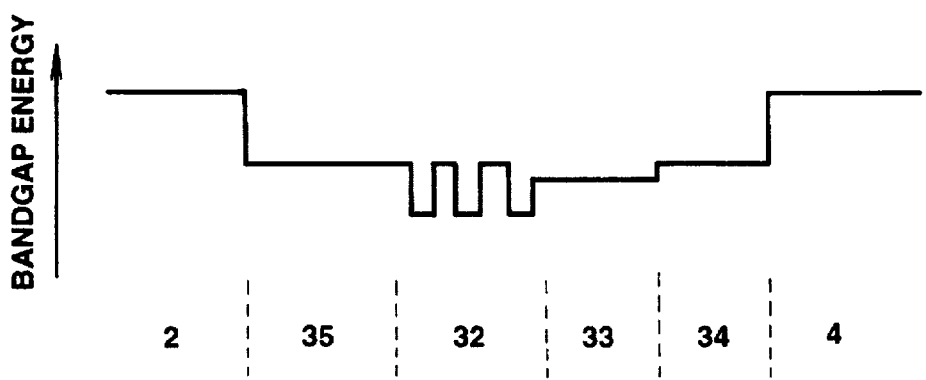
FIG. 3 illustrates the energy band structure of a phase adjusting region of the first embodiment.

FIG. 3 illustrates bandgaps of the layers near (and including) the phase shift region 32, using only energy levels in the conduction band. The phase shift region 32 is transparent to light generated in the active layers 31a and 31b, and the refractive index of the phase shift region 32 is varied by a current injection thereinto. Here, the phase shift region 32 consists of three quantum wells. The well layer is a $GaAs_{0.9}P_{0.1}$ layer which has a thickness of 60Å and whose lattice constant is smaller than that of the substrate 1 (i.e., a tensile strain is introduced thereinto), and the barrier layer is an $Al_{0.3}Ga_{0.7}As$ layer having a thickness of 100Å.

Figure 4:
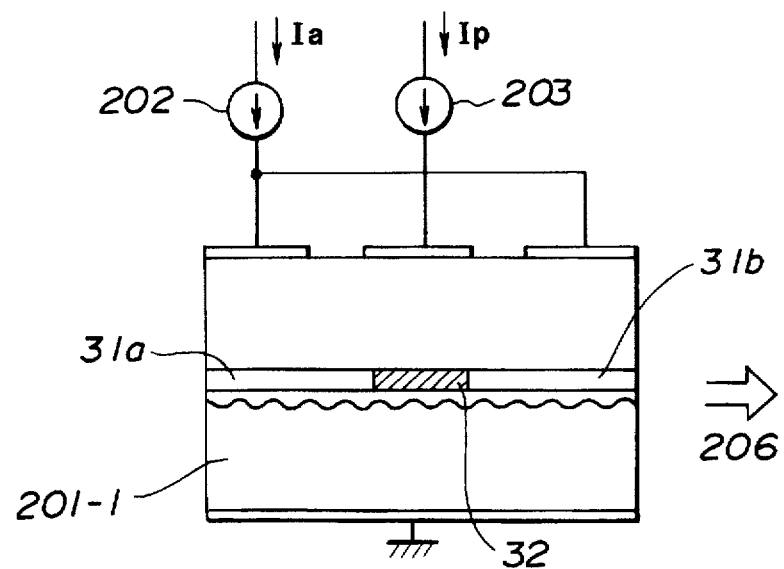
FIG. 4 is a cross sectional view illustrating a driving method of the first embodiment.

A laser driving method of this embodiment will now be described with reference to FIGS. 4 and 5. In FIG. 4, reference numeral 201-1 is a semiconductor laser constructed in accordance with the present invention. Reference numeral 202 is an electric source, and the source 202 injects a current $I_a$ into the active layers 31a and 31b through the second and fourth electrodes 8 and 10. Reference numeral 203 is another electric source, and the source 203 injects a current $I_p$ into the phase shift region 32 through the third electrode 9. Reference numeral 206 is a light output from the semiconductor laser 201-1. In this semiconductor laser 201-1, a grating is formed under the active layers 31a and 31b, different from the device shown in FIG. 1.

Figure 5:
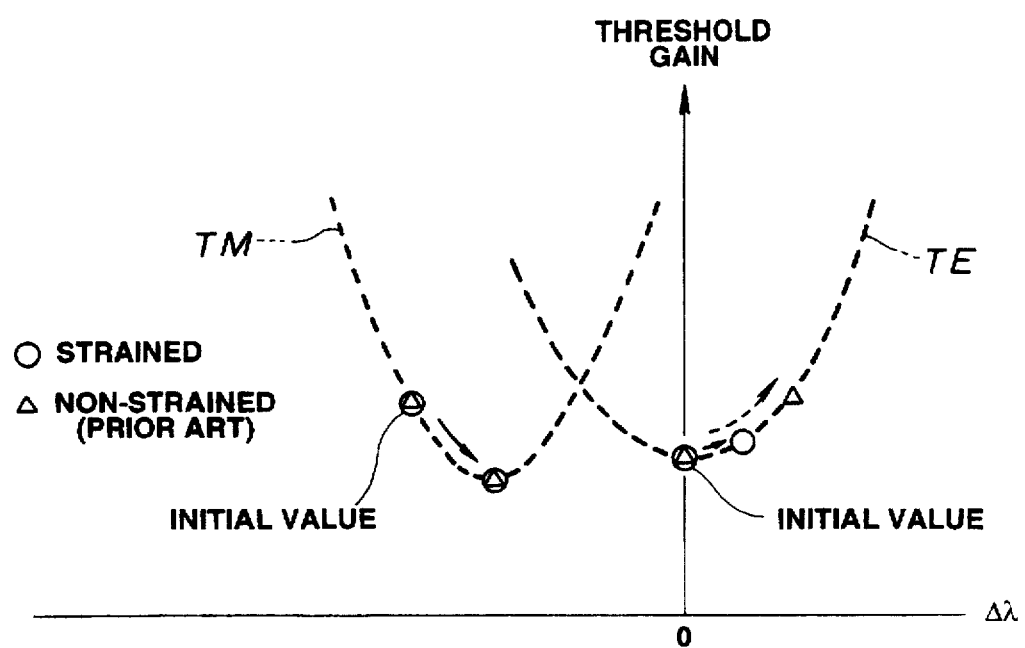
FIG. 5 is a graph illustrating the operation principle of the first embodiment.

FIG. 5 illustrates wavelength dependencies of threshold gains for light in TE and TM modes. The abscissa indicates a deviation amount from the Bragg wavelength for light in TE mode. In this embodiment, the threshold gain for light in TM mode at its Bragg wavelength is set such that it can be smaller than the threshold gain for light in TE mode at its Bragg wavelength. Further, in an initial state, a current is injected into the phase shift region 32 such that the phase condition is satisfied at the Bragg wavelength for light in TE mode and the threshold gain thereat stands at a minimum value. At the same time, the phase condition for TM mode is satisfied at a wavelength slightly different from the Bragg wavelength for light in TM mode, and the threshold gain thereof is larger than the threshold gain for light in TE mode at its Bragg wavelength.

In this state, when the current injected into the phase shift region 32 is increased, the phase-matching wavelength for light in TM mode varies and the threshold gain for light in TM mode gradually decreases while the phase-matching wavelength for light in TE mode varies only a little, because the phase shift region 32 has the above-discussed strained quantum well structure. Thus, the threshold gain for light in TM mode becomes lower than the threshold gain for light in TE mode, and light in TM mode begins to be emitted. During that transition state, since the wavelength of the phase-matching light in TE mode hardly varies, fluctuation in the intensity of an output until the oscillation in TM mode is much smaller than that of a prior art device. In FIG. 5, behavior of this embodiment is indicated by circles ○, and that of a prior art device is indicated by triangles △.

Second Embodiment

Figure 6:
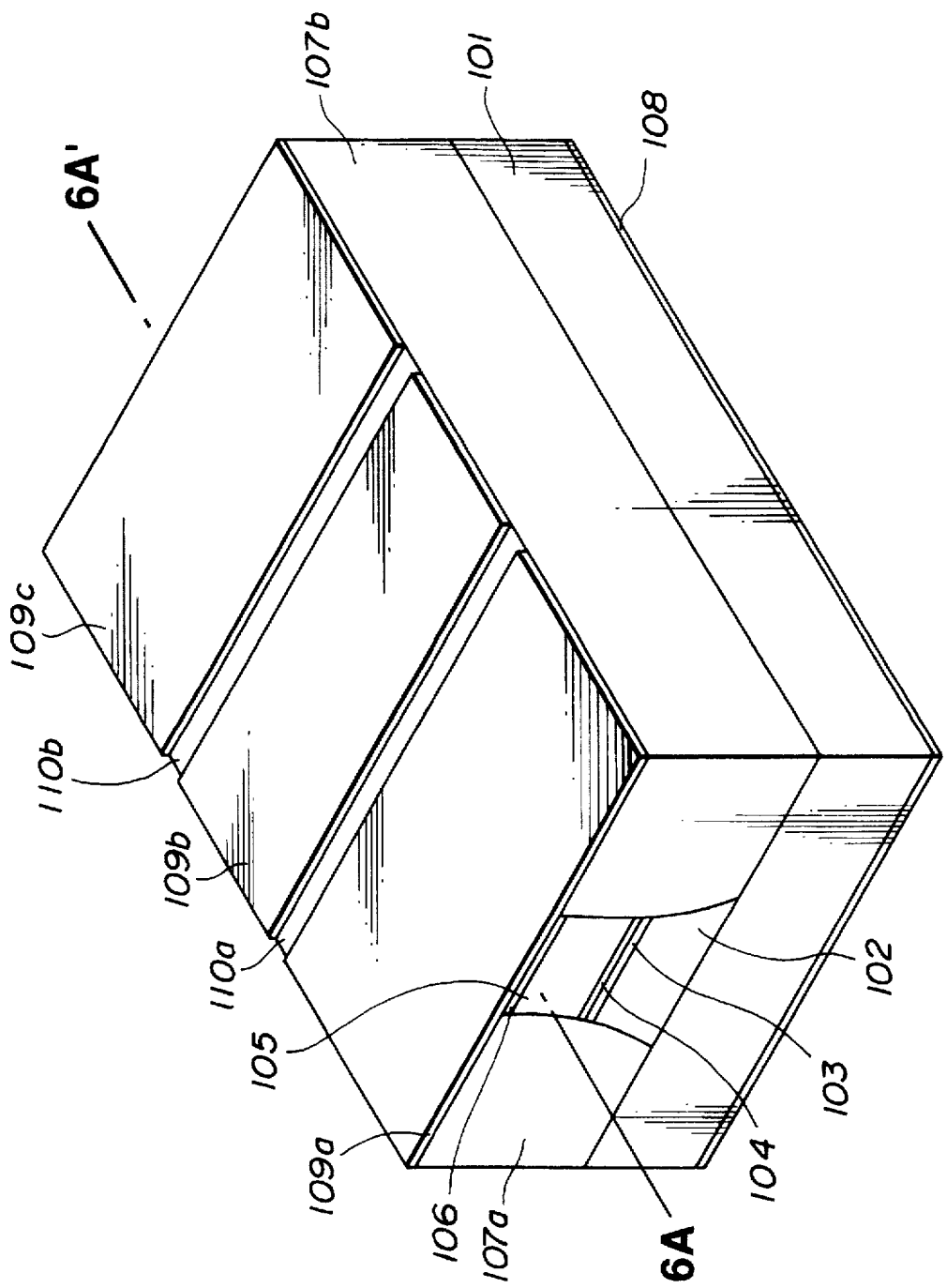
FIG. 6 is a perspective view illustrating the schematic structure of a second embodiment of a semiconductor laser constructed in accord with the present invention.
Figure 7:
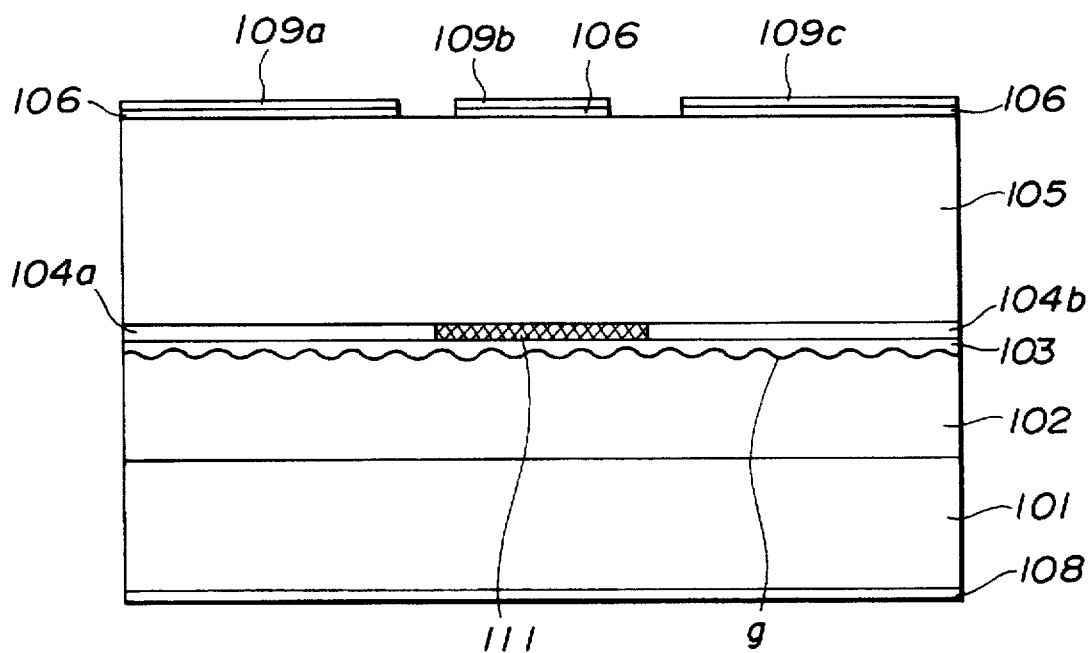
FIG. 7 is a 6A—6A' cross sectional view of FIG. 6.

A second embodiment of the present invention will be described with reference to FIGS. 6 and 7 which illustrate a distributed feedback semiconductor laser constructed using materials of longer wavelength series. In FIGS. 6 and 7, reference numeral 101 is an n-type InP semiconductor substrate. Reference numeral 102 is an n-type first clad layer. Reference numeral 103 is an undoped $In_{0.71}Ga_{0.29}As_{0.62}P_{0.38}$ carrier blocking layer having a thickness of about 0.2 μm. Reference numerals 104a and 104b are respectively undoped InGaAsP active layers whose band gap wavelengths are 1.5 μm. Reference numeral 105 is a p-type second InP clad layer having a thickness of about 1.5 μm. Reference numeral 106 is a p-type $In_{0.59}Ga_{0.41}As_{0.9}P_{0.1}$ cap layer. Reference numerals 107a and 107b are respectively high-resistance InP burying layers. Reference numeral 108 is a metal electrode of AuGeNi/Au. Reference numerals 109a, 109b and 109c are metal electrodes of Cr/AuZnNi/Au, respectively. Reference numerals 110a and 110b are separating grooves for dividing the electrodes 109a, 109b and 109c from each other. A grating g is formed at a boundary between the first clad layer 102 and the carrier blocking layer 103.

FIG. 7 illustrates a cross section of the device taken along a line 6A—6A'. In FIG. 7, reference numeral 111 is a phase shift region having a strained quantum well structure. The phase shift region 111 consists of a multiple (three) quantum well structure into which a tensile strain is introduced. The well layer is an $In_{0.4}Ga_{0.6}As$ layer having a tensile strain of 0.9% and a thickness of 5 nm, and the barrier layer is an InGaAsP layer having a 1.1 μm composition and a thickness of 10 nm.

A laser driving method of this embodiment is substantially the same as the first embodiment. This embodiment can also attain the same effects as the above-discussed device of GaAs series.

Third Embodiment

Figure 8:
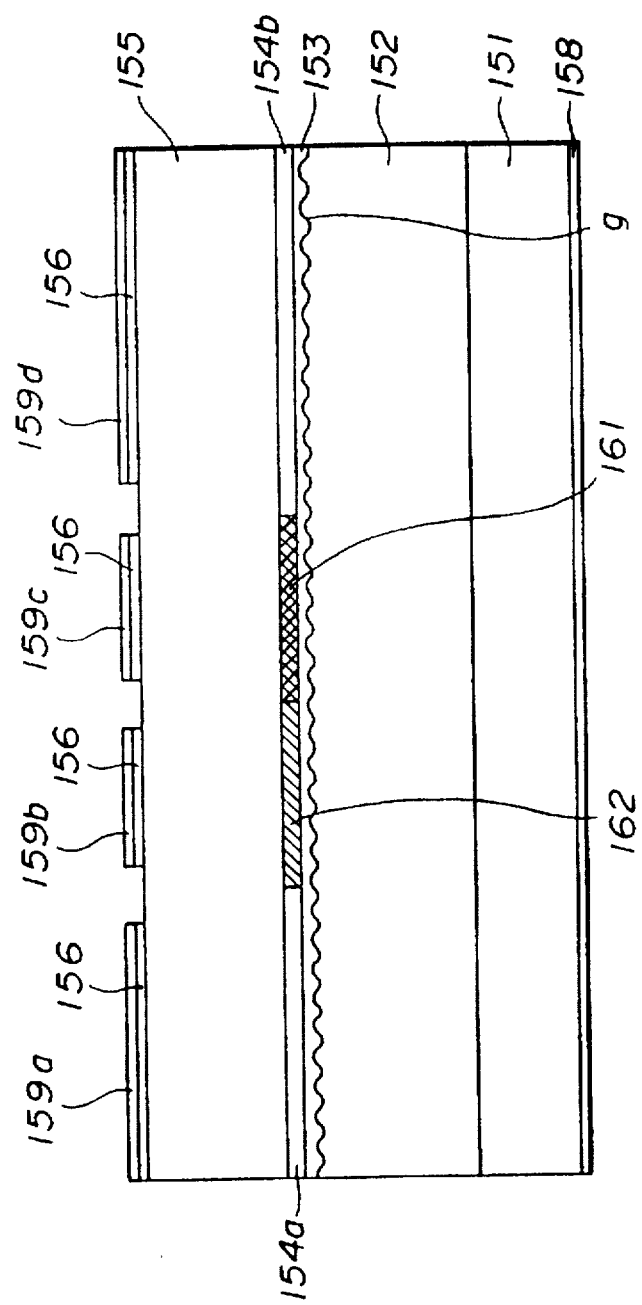
FIG. 8 is a cross sectional view illustrating a third embodiment of a semiconductor laser constructed in accord with the present invention.

A third embodiment of the present invention will be described with reference to FIG. 8 which illustrates a distributed feedback semiconductor laser. In FIG. 8, reference numeral 151 is an n-type InP semiconductor substrate. Reference numeral 152 is an n-type first clad layer. Reference numeral 153 is an undoped $In_{0.71}Ga_{0.29}As_{0.62}P_{0.38}$ carrier blocking layer having a thickness of about 0.2 μm. Reference numerals 154a and 154b are respectively undoped InGaAsP active layers whose band gap wavelengths are 1.5 μm. Reference numeral 155 is a p-type second InP clad layer having a thickness of about 1.5 μm. Reference numeral 156 is a p-type $In_{0.59}Ga_{0.41}As_{0.9}P_{0.1}$ cap layer. Reference numeral 158 is a first metal electrode of AuGeNi/Au formed on the bottom surface of the substrate 151. Reference numerals 159a, 159b, 159c and 159d are respectively second, third, fourth and fifth metal electrodes of Cr/AuZnNi/Au. A grating g is formed at a boundary between the first clad layer 152 and the carrier blocking layer 153. In the third embodiment, there are first and second phase shift regions 161 and 162. The first phase shift region 161 is constructed in the same manner as the phase shift region 111 of the second embodiment. The second phase shift region 162 has a quantum well structure into which a compressive strain is introduced. In the compressive strain quantum well structure, a change in the refractive index due to carrier injection is larger for TE mode than for TM mode, contrary to the tensile-strain quantum well structure used in the first and second embodiments.

Figure 9:
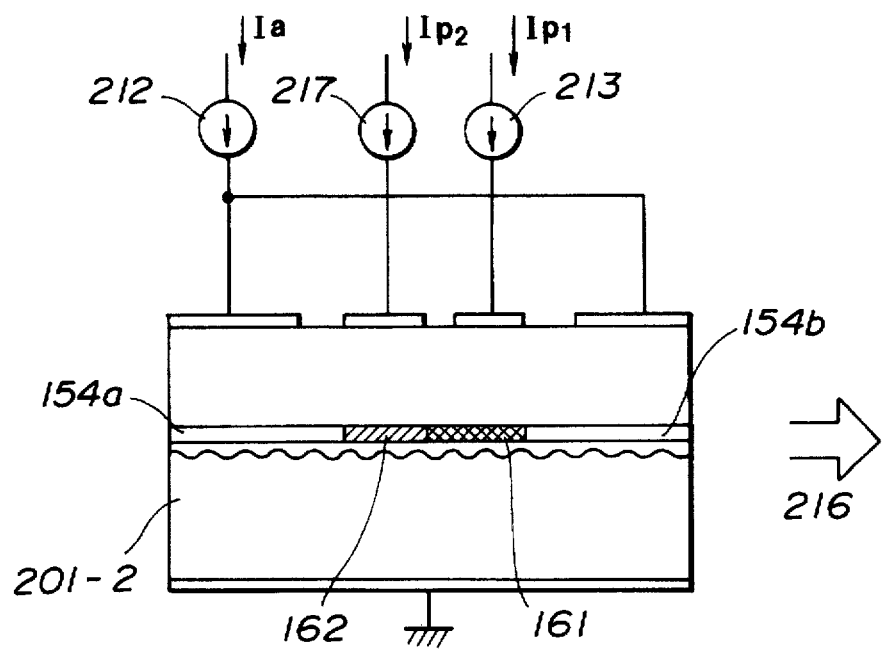
FIG. 9 is a cross sectional view illustrating a driving method of the third embodiment.

A laser driving method of the third embodiment will be now described with reference to FIG. 9. In FIG. 9, reference numeral 201-2 is a semiconductor laser of the third embodiment. Reference numerals 212, 213 and 217 are respectively electric sources, and the source 212 injects a current $I_a$ into the active layers 154a and 154b through the second and fifth electrodes 159a and 159d. The source 213 injects a current $I_{p1}$ into the first phase shift region 161 through the fourth electrode 159c. The source 217 injects a current $I_{p2}$ into the second phase shift region 162 through the third electrode 159b. Reference numeral 216 is a light output from the semiconductor laser 201-2.

In the third embodiment, the laser is initially set in a state in which light is oscillated in TE mode. The polarization mode of a light output can be changed from TE mode to TM mode by injecting carriers into the first phase shift region 161. At this time, when an amount of carriers injected into the second phase shift region 162 is controlled, fluctuation in the output intensity of TE light can further be reduced during the change from TE light to TM light. In this case, the phase of a varying amount of carriers injected into the second phase shift region 162 should be in anti-phase (deviated by 180 degrees) with the phase of a varying amount of carriers injected into the first phase shift region 161. Further, in the initial state, non-zero amounts of current should be injected into the first and second phase shift regions 161 and 162, and the refractive indices of the first and second shift regions 161 and 162 need to be respectively changed toward either of the plus or minus directions by controlling the amounts of carriers injected into the first and second phase shift regions 161 and 162.

In the above embodiments, a DFB laser is used, but the present invention can be applied to a distributed Bragg reflector (DBR) laser. In the DBR laser, the above-described phase shift region is used as a phase adjusting region, for example.

Fourth Embodiment

Figure 10:
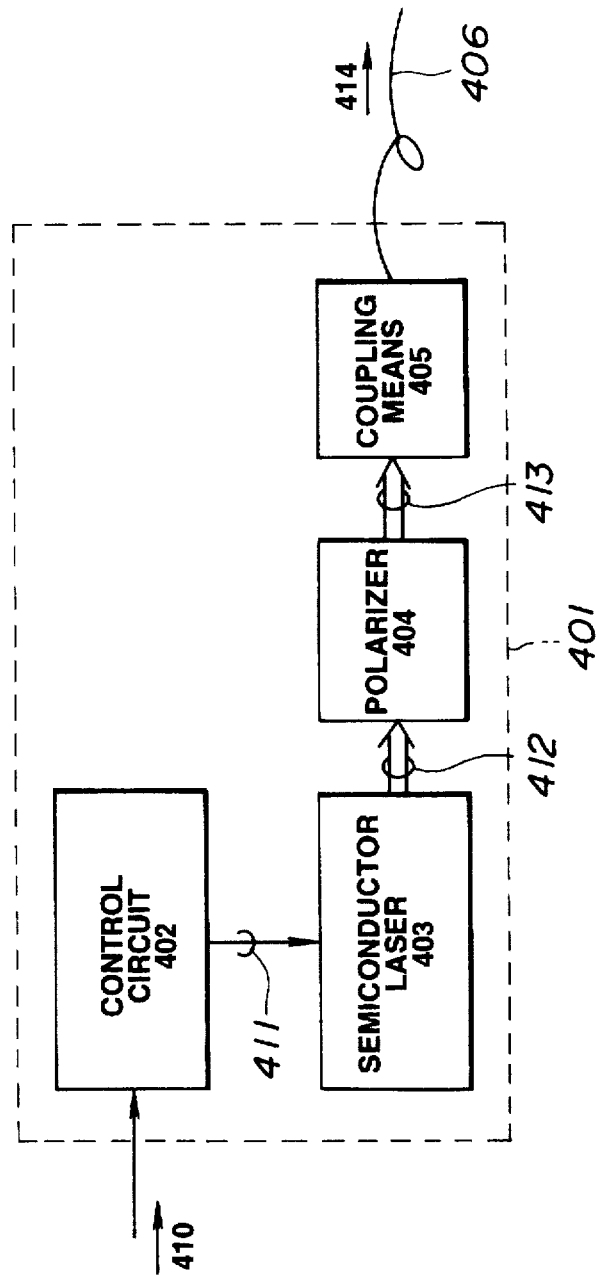
FIG. 10 is a block diagram illustrating an embodiment of a light transmitter which uses a semiconductor laser constructed in accord with the present invention.

In FIG. 10, an embodiment of a light transmitter including a semiconductor laser of the present invention is illustrated. In FIG. 10, reference numeral 402 is a control circuit. Reference numeral 403 is a semiconductor laser constructed in accordance with the present invention. Reference numeral 404 is a polarizer. Reference numeral 405 is an optical coupling means for coupling light transmitted in space to an optical fiber 406. Reference numeral 410 is an electric signal supplied from a terminal (not shown). Reference numeral 411 is a driving signal or signals supplied from the control circuit 402 to drive the semiconductor laser 403. Reference numeral 412 is a light signal emitted by the semiconductor laser 403 which is driven by the driving signal or signals 411. Reference numeral 413 is a light signal passed through the polarizer 404 which is adjusted such that one of two components of the optical signal 412 having mutually perpendicular polarization modes can be selected. Reference numeral 414 is an optical signal transmitted through the optical fiber 406. Reference numeral 401 is a light transmitter which uses the semiconductor laser 403 of the present invention. In this embodiment, the transmitter 401 includes control circuit 402, semiconductor laser 403, polarizer 404, optical coupling means 405, optical fiber 406 and the like.

The transmission operation of the light transmitter 401 of this embodiment will be described. When the electric signal 410 is supplied to the control circuit 402 from the terminal, the driving signal or signals 411 is supplied to the semiconductor laser 403 in accordance with the modulation method as illustrated in FIGS. 4 and 5, or FIG. 9.

The semiconductor laser 403 outputs the light signal 412 whose polarization state varies according to the driving signal 411. The light signal 412 is converted, by the polarizer 404, to the light signal 413 in one of the two polarization modes, and coupled to the optical fiber 406 by the optical coupling means 405. The thus-intensity-modulated light signal 414 is transmitted through the optical fiber 406 for optical communications.

In this case, since the light signal 414 is intensity-modulated, a conventional optical receiver constructed for use in intensity-modulation systems can be used to receive the light signal 414 transmitted by the optical fiber 406. The light transmitter 401 can also be employed in wavelength division multiplexing communications. In this case, a wavelength filter may be placed before a photodetector on the side of a receiver. In this embodiment, the apparatus is constructed as a light transmitter, but the apparatus can be used as a transmitter portion in a light transceiver.

The use of the thus-constructed transmitter is not limited to a simple optical communication in which communication is performed between two points. In other words, the transmitter can be used in any optical communication system that treats intensity-modulated signals, such as optical cable television (CATV) and optical local area networks (LAN) of any topology type (i.e., a bus type, a star type, a loop type and so forth).

As described above, according to the present invention, a portion, whose refractive index is to be changed, in a phase adjusting or controlling region is constructed with a strained quantum well structure in a semiconductor laser where phase adjustment is conducted by an external electric control. Hence, the polarization mode of a light output can be changed by a current whose amount is smaller than that of a prior art device, and fluctuation in the output intensity can be suppressed during a transition operation in polarization mode.

Except as otherwise disclosed herein, the various components shown in outline or block form in the Figures are individually well known in the optical semiconductor device and optical communication arts, and their internal construction and operation are not critical either to the making or using of the present invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An oscillation polarization mode selective semiconductor laser for selectively performing one of oscillations in different polarization modes, said laser comprising:

a substrate;

a laser structure formed on said substrate, said laser structure including an active region in which population inversion is established by a current injection thereinto; and a phase shift region formed in said laser structure, at least a portion of said phase shift region having a strained quantum well structure in which a different amount of strain compared to regions other than the phase shift region is introduced in the strained quantum well structure of said phase shift region to reduce the change of oscillation light intensity at the time of changing polarization mode of an oscillation light, in which degrees of a change in refractive index for internal light in different polarization modes due to a current injection thereinto are different from each other so that the change in refractive index for internal light in one of the different polarization modes is smaller than the change in refractive index for internal light in another of the different polarization modes.

2. An oscillation polarization mode selective semiconductor laser according to claim 1, wherein said phase shift region is sandwiched between a pair of said active regions along a resonance direction of said semiconductor laser.

3. An oscillation polarization mode selective semiconductor laser according to claim 1, wherein said semiconductor laser is constructed as a distributed feedback laser.

4. An oscillation polarization mode selective semiconductor laser according to claim 1, wherein said strained quantum well structure comprises a strained quantum well structure into which a tensile strain is introduced.

5. An oscillation polarization mode selective semiconductor laser according to claim 1, wherein said strained quantum well structure comprises a strained quantum well structure into which a compressive strain is introduced.

6. An oscillation polarization mode selective semiconductor laser for selectively performing one of oscillations in different polarization modes, said laser comprising:

a substrate;

a laser structure formed on said substrate, said laser structure including an active region in which population inversion is established by a current injection thereinto; and a phase shift region formed in said laser structure, at least a portion of said phase shift region having a strained quantum well structure in which degrees of a change in refractive index for internal light in different polarization modes due to a current injection thereinto are different from each other so that the change in refractive index for internal light in one of the different polarization modes is smaller than the change in refractive index for internal light in another of the different polarization modes, wherein said strained quantum well structure comprises a first strained quantum well structure into which a tensile strain is introduced and a second strained quantum well structure into which a compressive strain is introduced, said first and second strained quantum well structures being electrically controllable independently from each other.

7. A driving method for driving an oscillation polarization mode selective semiconductor laser for selectively performing one of oscillations in different polarization modes, said laser comprising a substrate, a laser structure formed on the substrate, said laser structure including an active region in which population inversion is established by a current injection thereinto, and a phase shift region formed in the laser structure, at least a portion of said phase shift region having a strained quantum well structure in which a different amount of strain compared to regions other than the phase shift region is introduced in the strained quantum well structure of said phase shift region to reduce the change of oscillation light intensity at the time of changing polarization mode of an oscillation light, in which degrees of a change in refractive index for internal light in different polarization modes due to a current injection thereinto are different from each other so that the change in refractive index for internal light in one of the different polarization modes is smaller than the change in refractive index for internal light in another of the different polarization modes, said driving method comprising:

a step of injecting a direct current, which has a constant intensity, into the active region; and a step of injecting a modulated current, which has a modulation frequency, into the phase shift region.

8. A driving method for driving an oscillation polarization mode selective semiconductor laser for selectively performing one of oscillations in different polarization modes, said laser comprising a substrate, a laser structure formed on the substrate, said laser structure including an active region in which population inversion is established by a current injection thereinto, and a phase shift region formed in the laser structure, at least a portion of said phase shift region having a first strained quantum well structure into which a tensile strain is introduced and a second strained quantum well structure into which a compressive strain is introduced, and said first and second strained quantum well structures being electrically controllable independently from each other, said driving method comprising:

a step of injecting a direct current, which has a constant intensity, into the active region;

a step of injecting a first modulated current, which has a modulation frequency, into one of the first and second strained quantum well structure; and a step of injecting a second modulated current, which has a modulation frequency in anti-phase with the modulation frequency of the first modulated current, into the other of the first and second strained quantum well structure.

9. A light transmitter comprising:

an oscillation polarization mode selective semiconductor laser for selectively performing one of oscillations in different polarization modes, said laser including a substrate, a laser structure formed on the substrate, said laser structure including an active region in which population inversion is established by a current injection thereinto, and a phase shift region formed in the laser structure, at least a portion of said phase shift region having a strained quantum well structure in which a different amount of strain compared to regions other than the phase shift region is introduced in the strained quantum well structure of said phase shift region to reduce the change of oscillation light intensity at the time of changing polarization mode of an oscillation light, in which degrees of a change in refractive index for internal light in different polarization modes due to a current injection thereinto are different from each other so that the change in refractive index for internal light in one of the different polarization modes is smaller than the change in refractive index for internal light in another of the different polarization modes;

control means for modulating output light of said semiconductor laser in its polarization mode in accordance with an input signal supplied to said control means; and polarization mode selective means for transmitting therethrough only light in one of the different polarization modes from said semiconductor laser.

10. An optical communication system comprising:

(a) a light transmitter, said light transmitter including:

an oscillation polarization mode selective semiconductor laser for selectively performing one of oscillations in different polarization modes, said laser including a substrate, a laser structure formed on the substrate, said laser structure including an active region in which population inversion is established by a current injection thereinto, and a phase shift region formed in the laser structure, at least a portion of said phase shift region having a strained quantum well structure in which a different amount of strain compared to regions other than the phase shift region is introduced in the strained quantum well structure of said phase shift region to reduce the change of oscillation light intensity at the time of changing polarization mode of an oscillation light, in which degrees of a change in refractive index for internal light in different polarization modes due to a current injection thereinto are different from each other so that the change in refractive index for internal light in one of the different polarization modes is smaller than the change in refractive index for internal light in another of the different polarization modes;

control means for modulating output light of said semiconductor laser in its polarization mode in accordance with an input signal supplied to said control means; and polarization mode selective means for transmitting therethrough only light in one of the different polarization modes from said semiconductor laser;

(b) transmission means for transmitting the light selected by said polarization mode selective means; and (c) a receiver for receiving the light transmitted by said transmission means.

11. An optical communication system according to claim 10, wherein said system is constructed as a wavelength division multiplexing communication system.

12. An oscillation polarization mode selective semiconductor laser according to claim 1, wherein said strained quantum well structure is transparent to light generated in said active region.

13. An oscillation polarization mode selective semiconductor laser for selectively performing one of oscillations in different polarization modes, said laser comprising:

a substrate;

a laser structure formed on said substrate, said laser structure including an active region in which population inversion is established by a current injection thereinto; and a phase shift region formed in said laser structure, at least a portion of said phase shift region having a strained quantum well structure in which decrees of a change in refractive index for internal light in different polarization modes due to a current infection thereinto are different from each other so that the change in refractive index for internal light in one of the different polarization modes is smaller than the change in refractive index for internal light in another of the different polarization modes, wherein a bandgap of said strained quantum well structure is wider than a bandgap of said active region.

\* \* \* \* \*

UNITED STATES PATENT AND TRADEMARK OFFICE
CERTIFICATE OF CORRECTION

PATENT NO. : 5,790,581
DATED : August 4, 1998
INVENTOR(S) : Nitta

Page 1 of 2

It is certified that error appears in the above-indentified patent and that said Letters Patent is hereby corrected as shown below: On the title page, item

[56] References Cited:

FOREIGN PATENT DOCUMENTS

"Germany" should read --European Pat. Off.--; and "2159781" should read --2-159781--.

COLUMN 4:

Line 1, "The" should read --the--.

COLUMN 5:

Line 52, "$I_a$" should read --$I_8$--.

COLUMN 9:

Line 3, "structure;" should read --structures;--.

UNITED STATES PATENT AND TRADEMARK OFFICE
CERTIFICATE OF CORRECTION

PATENT NO. : 5,790,581
DATED : August 4, 1998
INVENTOR(S) : Nitta

It is certified that error appears in the above-indentified patent and that said Letters Patent is hereby corrected as shown below:

COLUMN 10:

Line 40, "decrees" should read --degrees--.

Signed and Sealed this

First Day of June, 1999

Attest:

Q. TODD DICKINSON

Attesting Officer

Acting Commissioner of Patents and Trademarks